(12) United States Patent
Pekarik et al.

(10) Patent No.: US 11,374,092 B2
(45) Date of Patent: Jun. 28, 2022

(54) VIRTUAL BULK IN SEMICONDUCTOR ON INSULATOR TECHNOLOGY

(71) Applicant: GLOBALFOUNDRIES U.S. INC., Santa Clara, CA (US)

(72) Inventors: John J. Pekarik, Underhill, VT (US); Vibhor Jain, Essex Junction, VT (US); Herbert Ho, New Windsor, NY (US); Claude Ortolland, Garrison, NY (US); Qizhi Liu, Lexington, MA (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 176 days.

(21) Appl. No.: 16/784,813

(22) Filed: Feb. 7, 2020

(65) Prior Publication Data

US 2021/0091180 A1    Mar. 25, 2021

Related U.S. Application Data

(60) Provisional application No. 62/904,424, filed on Sep. 23, 2019.

(51) Int. Cl.
*H01L 29/08*    (2006.01)
*H01L 29/165*   (2006.01)
*H01L 29/737*   (2006.01)
*H01L 29/66*    (2006.01)

(52) U.S. Cl.
CPC ........ *H01L 29/0821* (2013.01); *H01L 29/165* (2013.01); *H01L 29/66287* (2013.01); *H01L 29/7378* (2013.01)

(58) Field of Classification Search
CPC .............. H01L 29/0821; H01L 29/165; H01L 29/7378; H01L 29/66287; H01L 29/0649; H01L 29/66242; H01L 29/0826
See application file for complete search history.

(56) References Cited

U.S. PATENT DOCUMENTS

| 4,567,645 | A  |   | 2/1986  | Cavanagh et al. |
|-----------|----|---|---------|-----------------|
| 6,569,730 | B2 |   | 5/2003  | Tsai et al.     |
| 7,485,537 | B2 |   | 2/2009  | Ho et al.       |
| 8,003,473 | B2 | * | 8/2011  | Pagette ............... H01L 29/0821 257/E29.034 |
| 9,514,998 | B1 |   | 12/2016 | Basker et al.   |
| 2011/0147892 | A1 | * | 6/2011 | Chiu ..................... H01L 29/732 257/E29.171 |
| 2012/0235143 | A1 | * | 9/2012 | Cai ................... H01L 21/76229 257/51 |

\* cited by examiner

*Primary Examiner* — Jose R Diaz
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to virtual bulk in semiconductor on insulator technology and methods of manufacture. The structure includes a heterojunction bipolar transistor formed on a semiconductor on insulator (SOI) wafer with a doped sub-collector material in a buried insulator region under a semiconductor substrate of the SOI wafer.

17 Claims, 4 Drawing Sheets

US 11,374,092 B2

VIRTUAL BULK IN SEMICONDUCTOR ON INSULATOR TECHNOLOGY

FIELD OF THE INVENTION

The present disclosure relates to semiconductor structures and, more particularly, to virtual bulk in semiconductor on insulator technology and methods of manufacture.

BACKGROUND

In radio frequency (RF) applications, high cut-off frequency ($F_t$) of RF transistors is required. RFCMOS with advanced technology nodes can realize high cut-off frequency; however, RFCMOS still cannot satisfy the higher RF requirement (e.g., $F_t$ higher than 40 GHz).

Silicon bipolar junction transistor (BJT) and SiGe heterojunction bipolar transistor (HBT) technologies are a viable option for high $F_t$ devices. These devices can be built on semiconductor on insulator substrates. In these technologies, though, the buried insulator layer, e.g., buried oxide layer (BOX), prevents the device (bipolar NPN transistors) from direct access to the underlying substrate. This increases resistance-capacitance (Rc) and junction-to-ambient thermal resistance (Rth) for the bipolar NPN transistors.

SUMMARY

In an aspect of the disclosure, a structure comprises a heterojunction bipolar transistor formed on a semiconductor on insulator (SOI) wafer with a doped sub-collector material in a buried insulator region under a semiconductor substrate of the SOI wafer.

In an aspect of the disclosure, a structure comprises: a semiconductor on insulator wafer comprising a substrate, a buried oxide material on the substrate and a single crystalline semiconductor material on the buried oxide material; a doped sub-collector material within a buried oxide region of the semiconductor on insulator wafer, which is bounded on it edges by the buried oxide material and which is underneath the single crystalline semiconductor material; a base material on the single crystalline semiconductor material; and an emitter material on the base material.

In an aspect of the disclosure, a method comprises: forming trenches in a substrate of a semiconductor on insulator wafer to expose an underlying buried oxide material: forming a cavity in the underlying buried oxide material through the trenches in the substrate; depositing doped polysilicon material in the cavity and the openings formed in the substrate; removing the doped polysilicon material which fills the openings; forming shallow trench isolation regions in the openings which isolate portions of the substrate; forming a base region on the substrate, between the shallow trench isolation regions; and forming an emitter region on the base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to virtual bulk in semiconductor on insulator technology and methods of manufacture. In embodiments, the virtual bulk is formed within a cavity of semiconductor on insulator material, in which the virtual bulk is a doped polysilicon material. Advantageously, the present disclosure provides an improved resistance profile, i.e., decreased resistance of the substrate, with improved yields, for a heterojunction bipolar transistor.

In more specific embodiments, the insulator material, e.g., BOX, of the semiconductor on insulator technology is partially removed to create a cavity. The cavity is filled with n-doped or p-doped polysilicon material via openings extending through the substrate of the semiconductor on insulator technology. The with n-doped or p-doped polysilicon material is a virtual bulk, in contact with the underlying substrate and the semiconductor substrate material. Any doped polysilicon material that is within the openings is removed, which is then filled with insulator material to form isolation regions. An interfacial layer can be provided between the doped polysilicon material and substrate (e.g., Si) to reduce dopant diffusion. The doped polysilicon material can be used as a sub-collector region for a single crystal SiGe HBT formed on the semiconductor on insulator technology. The collector can be a single crystal material and the collector/sub-collector boundary is a highly doped region. In embodiments, shallow trench structures surround the collector region and the sub-collector region.

The structure of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
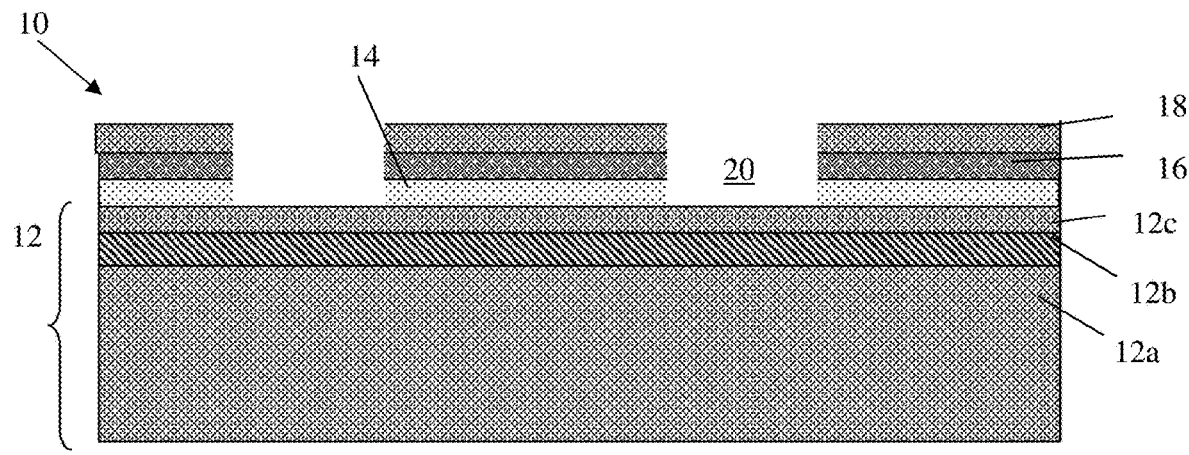
FIG. 1 shows a wafer with pad films, amongst other features, and respective fabrication processes in accordance with aspects of the present disclosure.

FIG. 1 shows a wafer with pad films, amongst other features, and respective fabrication processes in accordance with aspects of the present disclosure. More specifically, the structure 10 includes a wafer 12 comprised of a semiconductor material 12a and an insulator layer 12b bonded or deposited onto the semiconductor material 12a using conventional thermal oxidation process or other processes known to those of skill in the art, i.e., separation by implantation of oxygen (SIMOX), deposition and/or other suitable process. In embodiments, the semiconductor material 12a can be, e.g., Si or SiGe, and the insulator layer 12b can be any suitable material, including silicon oxide, sapphire, or, preferably, a buried oxide layer (BOX); although other suitable materials are contemplated herein. A substrate material 12c is deposited over or bonded directly to the insulator layer 12b. The substrate material 12c can be single crystalline Si or other suitable single crystalline material including, but not limited to, Si, SiGe, SiGeC, SiC, GaAs, InAs, InP, and other III/V or II/VI compound semiconductors. The substrate material 12c can be used as a collector for a HBT device, as an example and as discussed further herein.

Still referring to FIG. 1, pad films 14, 16 are deposited on the substrate material 12c. The pad film 14 can be, e.g., an oxide based material, and the pad film 16 can be, e.g., a nitride based material, both of which can be deposited by a conventional deposition process. For example, the deposition process can be a chemical vapor deposition (CVD) process. A mask 18 is deposited over the pad film 16. The mask 18 can be a hardmask used in conventional lithography and etching processes.

In embodiments, opening 20 are formed through the pad films 14, 16 and the mask 18. The opening 20 can be formed by conventional lithography, etching and deposition methods known to those of skill in the art. For example, a resist formed over the mask 18 is exposed to energy (light) to form a pattern (opening). An etching process with a selective chemistry, e.g., reactive ion etching (RIE), will be used to form the openings 20 in the mask 18 and pad films 14, 16 through the openings of the resist. The resist can then be removed by a conventional oxygen ashing process or other known stripants.

Figure 2:
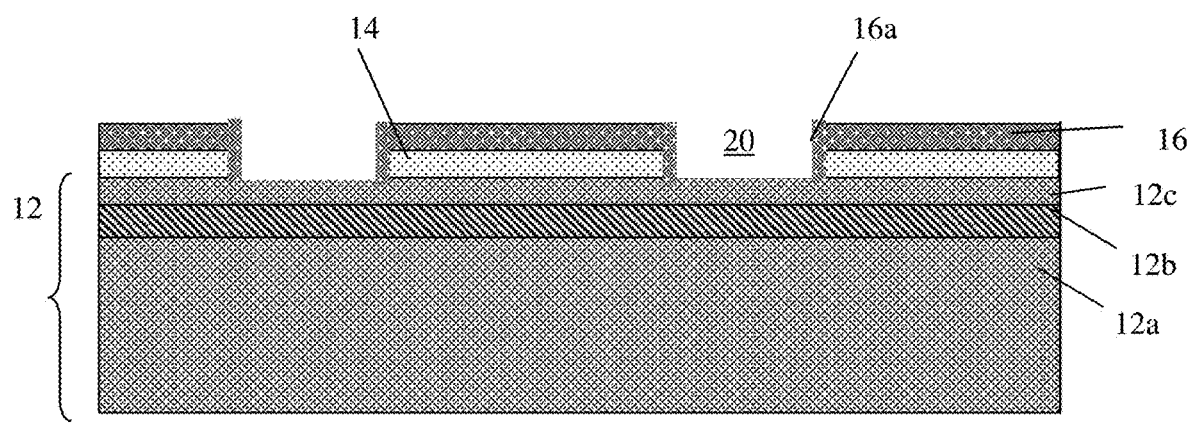
FIG. 2 shows openings in the pad films, amongst other features, and respective fabrication processes in accordance with aspects of the present disclosure.

As shown in FIG. 2, the mask 18 is removed by any conventional etching or stripping process. A sidewall spacer 16a is formed in the openings 20 to cover the pad film 14. In embodiments, the sidewall spacer 16a is a nitride material, which is used to prevent an undercut of the oxide material, e.g., pad film 14, during subsequent etching processes. In embodiments, the sidewall spacer 16a is formed by a deposition process, e.g., CVD, followed by an anisotropic etching process. As should be understood by those of ordinary skill in the art, the anisotropic etching process will remove material from the horizontal surfaces of the structure, while maintaining the material on vertical surfaces, e.g., within the openings 20.

Figure 3:
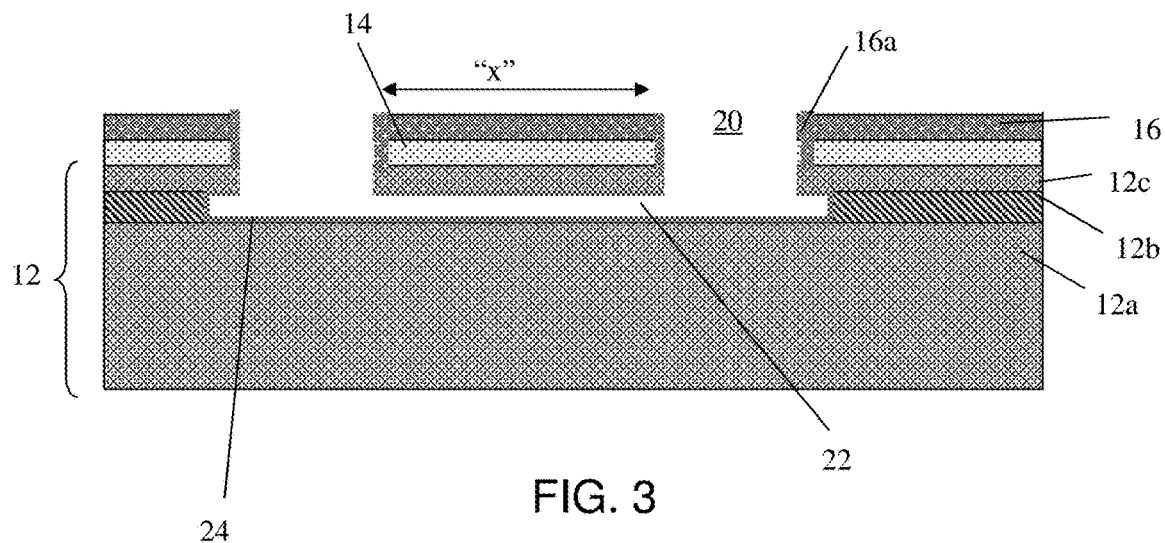
FIG. 3 shows a cavity in an underlying insulator layer, amongst other features, and respective fabrication processes in accordance with aspects of the present disclosure.

In FIG. 3, a cavity 22 is formed in the insulator layer 12b, e.g., BOX. In embodiments, the cavity 22 is formed by an undercut etch through the openings 20 in substrate material 12c and into the insulator layer 12b. The undercut etch can be performed by a dry etching processes of the substrate material 12c to expose the underlying insulator layer 12b (which extends the opening to expose the underlying insulator layer 12b), followed by an isotropic wet etch process of the insulator layer 12b. The cavity 22 (e.g., undercut) can have a ratio of 3:1 (length:width), as an example. In embodiments, the cavity 22 can have a height of approximately 0.1 µm; although other dimensions are contemplated depending on the thickness of the insulator layer 12b. In addition, the space "x" between the openings 20 will form the collector region of the HBT, and can range from about 0.2 µm to about 0.6 µm; although other dimensions are also contemplated herein.

In embodiments, the cavity 22 can be lined with material 24. For example, the cavity 22 can be lined with a monolayer of oxide formed by a rapid thermal oxidation process which will act as a barrier in subsequent processes. Alternatively, the cavity 22 can be lined with a, e.g., TiN, which will act as a barrier material to prevent dopant diffusion from occurring in subsequent processes.

Figure 4:
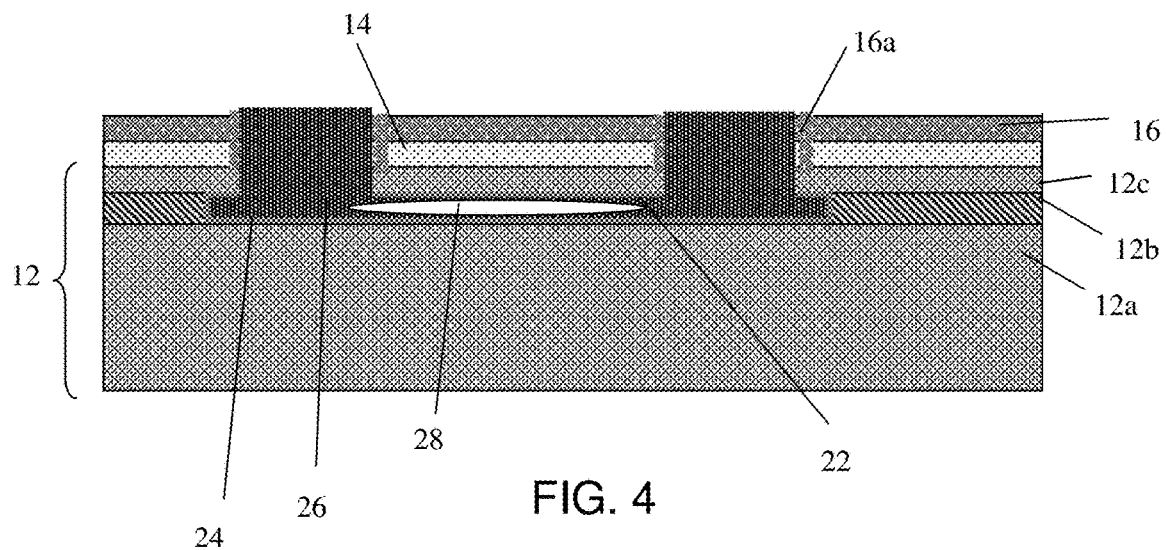
FIG. 4 shows the cavity filled with doped material for use as a sub-collector, amongst other features, and respective fabrication processes in accordance with aspects of the present disclosure.

FIG. 4 shows the cavity 22 and openings 20 filled with doped material 26, amongst other features. More specifically, the cavity 22 and the openings 20 are filled with a doped polysilicon material 26, e.g., N+ dope or P+ doped polysilicon material. In this way, the doped polysilicon material 26 will be bounded on its edges by the insulator layer 12b. The doped polysilicon material 26 can be deposited by a CVD process, followed by a planarization process, e.g., conventional chemical mechanical polish (CMP). Alternatively, the deposition process can be a selective epitaxial growth process. In further embodiments, the cavity 22 can be partially filled forming optional airgaps 28. In embodiments, the barrier metal (e.g. TiN) can be used to allow partially removal of the poly material 26 and back fill with metal (e.g., W or Cu).

Figure 5:
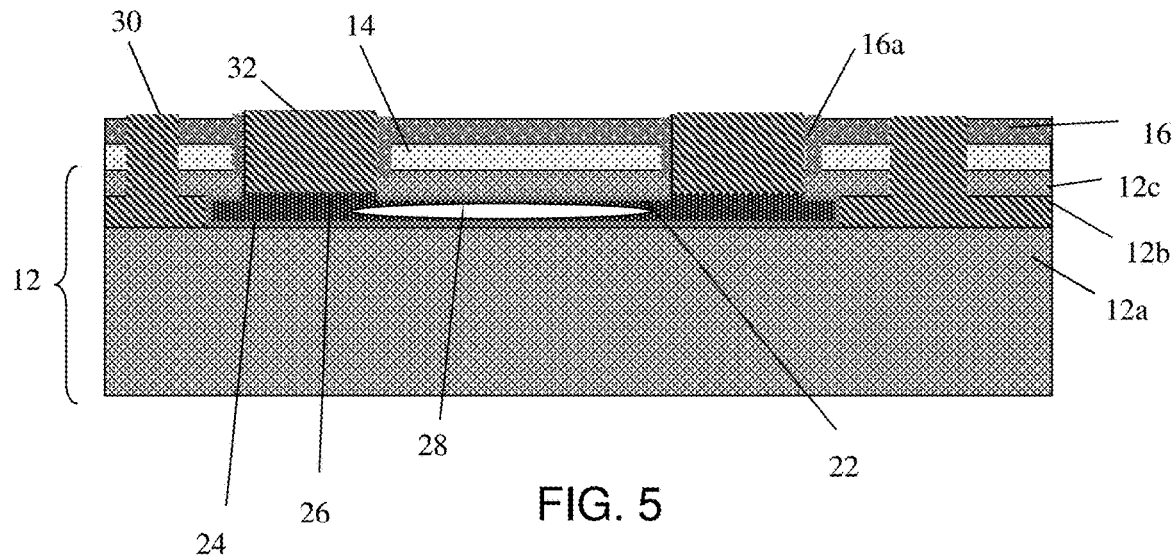
FIG. 5 shows shallow trench isolation regions, amongst other features, and respective fabrication processes in accordance with aspects of the present disclosure.

In FIG. 5, shallow trench isolation regions 30, 32 are formed in the structure. The shallow trench isolation regions 30, 32 are formed by conventional lithography, etching and deposition processes as already described herein. More particularly, shallow trench isolation regions 30 are formed within the substrate material 12c and extending to the insulator layer 12b. On the other hand, shallow trench isolation regions 32 are formed by removal of the doped polysilicon material 26 within the openings 20 and a subsequent deposition of the insulator material within these same openings 20. The shallow trench isolation regions 32 will extend to the doped polysilicon material 26 within the cavity 22. After the deposition of the insulator material, e.g., oxide material, a CMP process can be performed to remove any excess insulator material.

Figure 6:
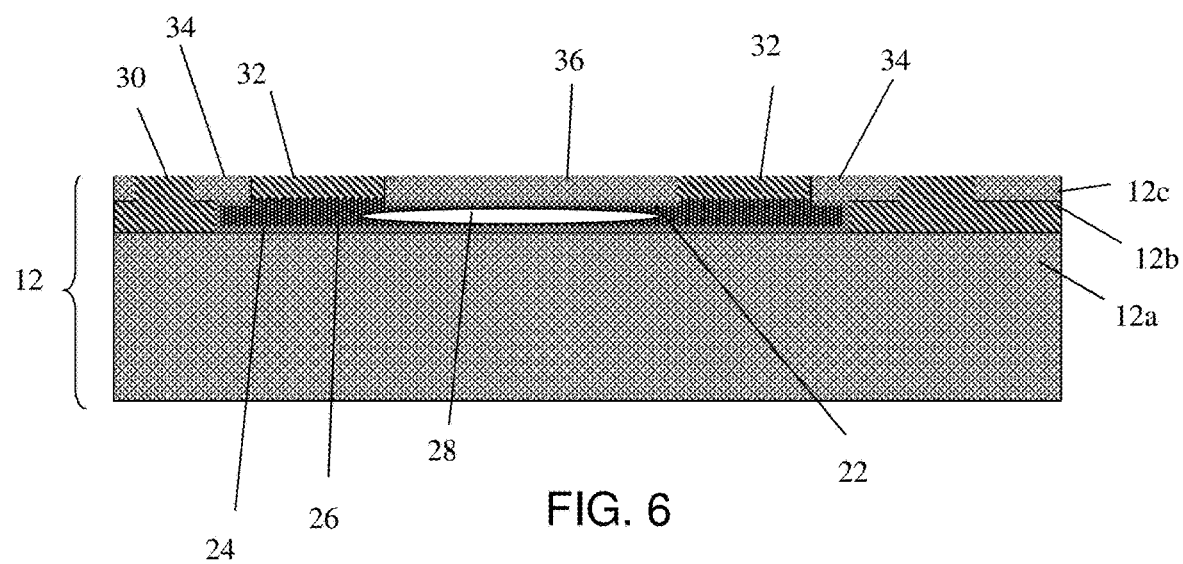
FIG. 6 shows contact regions and a collector region, amongst other features, and respective fabrication processes in accordance with aspects of the present disclosure.

In FIG. 6, the pad films are stripped to expose the substrate material 12c. In embodiments, the pad films can be stripped by conventional etching processes with a selective chemistry. As previously noted, the substrate material 12c which is now exposed will be used as a collector 36, in addition to collector contact regions 34. The collector 36 can be comprised of a single crystal Si material. Both the collector contact regions 34 and the collector 36 will directly contact the underlying doped polysilicon material 26 (i.e., sub-collector region). In this way, the boundary between the collector region 36 and the sub-collector region 26 is a highly doped region. Also, as shown in FIG. 6, the collector contact regions 34 are isolated by the shallow trench isolation regions 30, 32, and the collector 36 is isolated by the shallow trench isolation regions 32.

Figure 7:
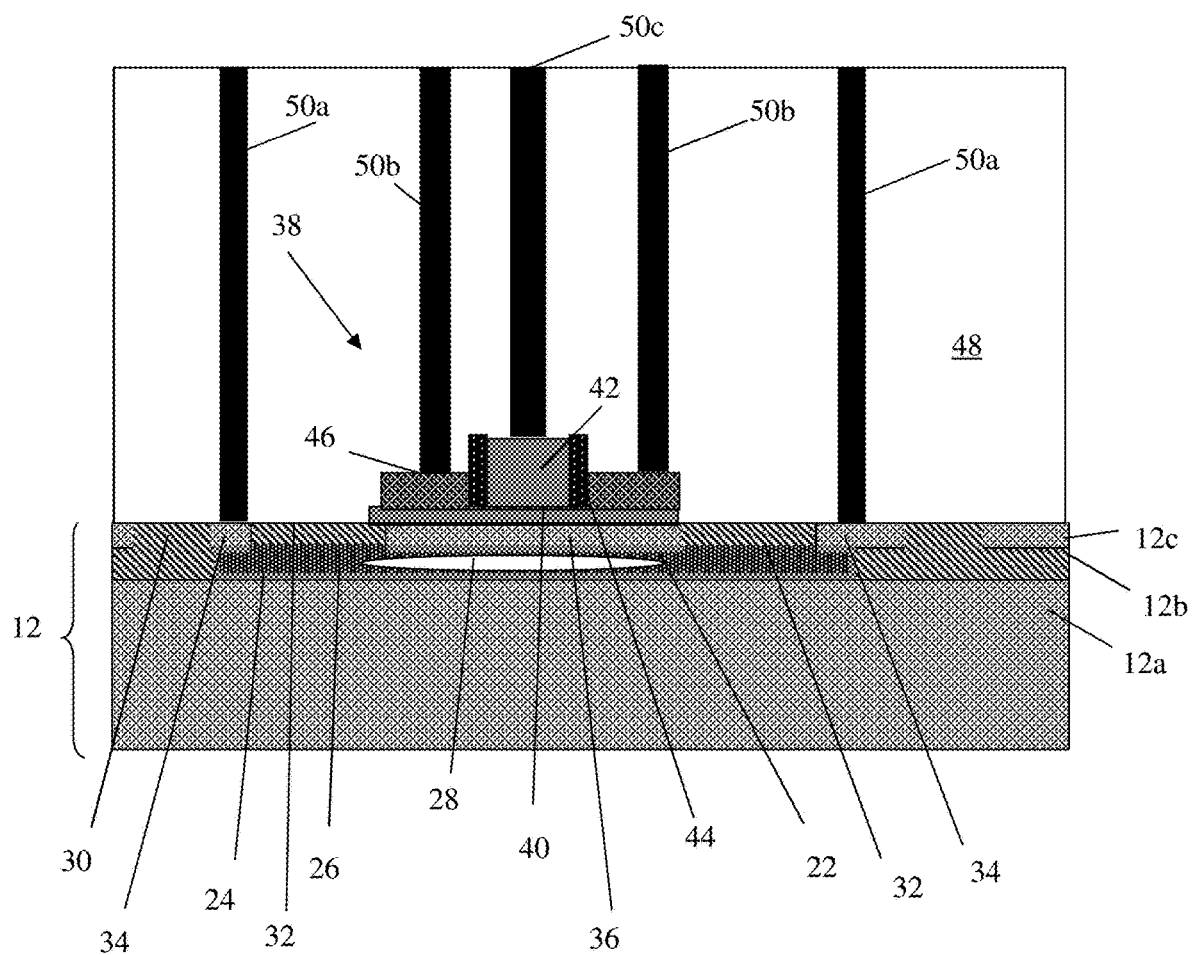
FIG. 7 shows a heterojunction transistor and respective contacts, amongst other features, and respective fabrication processes in accordance with aspects of the present disclosure.

FIG. 7 shows a heterojunction transistor 38, amongst other features, and respective fabrication processes in accordance with aspects of the present disclosure. More specifically, the heterojunction transistor 38 includes an intrinsic base region 40 formed on the substrate material 12c of the collector region 36. In embodiments, the base region 40 can be composed of single crystalline SiGe material, which is aligned with both the collector region 36 and the doped polysilicon material 26 forming the sub-collector region.

An emitter region 42 is formed over and in contact with the base region 40. In embodiments, the emitter region 42 can be composed of single crystalline Si material, as an example. The emitter region 42 is bounded by sidewall spacers 44. In embodiments, the sidewall spacers 44 can be a nitride material formed by a deposition process and anisotropic etching process. Raised extrinsic base regions 46 are formed over the base region 40, outside of the sidewall spacers 44 which isolate the raised extrinsic base regions 44 from the emitter region 42. The raised extrinsic base regions 46 can be fabricated by conventional doped epitaxial growth processes as is known in the art, i.e., comprising single crystalline Si material.

Still referring to FIG. 7, contacts 50a, 50b and 50c are provided in contact with the collector contact regions 34, raised extrinsic base regions 46 and emitter region 42, respectively. Prior to forming of the contacts, 50a, 50b and 50c, the exposed contact surfaces, i.e., collector contact regions 34 and raised extrinsic base region 46, undergo a silicide process which begins with deposition of a thin transition metal layer, e.g., nickel, cobalt or titanium, followed by an anneal process to form a low-resistance transition metal silicide.

Following the anneal process, a dielectric material 48 is deposited over the contact regions and the heterojunction transistor 38. The dielectric material 48 can be, e.g., an interlevel dielectric material of oxide, deposited by a conventional CVD process. Trenches are formed in the dielectric material 48 to expose the silicided contact regions and the emitter region. The trenches can be formed by conventional lithography and etching processes as already described herein. Metal material, e.g., tungsten or aluminum, or alloys thereof, is deposited on the silicide regions and within the trenches to form the contacts, 50a, 50b and 50c. Any excess metal material can be removed by a CMP process.

The structures described herein can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a heterojunction bipolar transistor formed on a semiconductor on insulator (SOI) wafer with a doped sub-collector material in a buried insulator region under a semiconductor substrate of the SOI wafer, wherein the doped sub-collector material is doped polysilicon material bounded by oxide material of the buried insulator region and in contact at its upper surface with single crystalline semiconductor material of a collector region.

2. The structure of claim 1, wherein the doped polysilicon material is N+ doped.

3. The structure of claim 1, wherein the doped polysilicon material is P+ doped.

4. The structure of claim 1, further comprising a base region comprised of single crystalline semiconductor material over the collector region and an emitter region on the base region.

5. The structure of claim 4, wherein the base region is single crystalline SiGe material and the emitter region is comprised of single crystalline Si material.

6. The structure of claim 1, wherein the doped sub-collector material is in direct contact with a diffusion barrier material in the buried insulator region.

7. The structure of claim 6, wherein the diffusion barrier material is an oxide material.

8. The structure of claim 6, wherein the diffusion barrier material is TiN metal.

9. A structure comprising:
   a semiconductor on insulator wafer comprising a substrate, a buried oxide material on the substrate and a single crystalline semiconductor material on the buried oxide material;
   a doped sub-collector material within a buried oxide region of the semiconductor on insulator wafer, the doped sub-collector material being bounded on it edges by the buried oxide material and directly underneath the single crystalline semiconductor material;
   a base material on the single crystalline semiconductor material; and
   an emitter material on the base material,
   wherein the doped sub-collector material is N+ doped or P+ doped polysilicon material.

10. The structure of claim 9, wherein the single crystalline semiconductor material is a collector and collector contact regions in direct contact with the doped sub-collector material.

11. The structure of claim 10, wherein the base material is single crystalline SiGe material and the emitter region is comprised of single crystalline Si material.

12. The structure of claim 10, wherein the collector and the collector contact regions are isolated by shallow trench isolation regions.

13. The structure of claim 9, wherein the base is an intrinsic base and a raised extrinsic base isolated from the emitter by sidewall spacers.

14. The structure of claim 9, wherein the doped sub-collector material is in direct contact with a diffusion barrier material in the buried oxide region.

15. The structure of claim 9, wherein the diffusion barrier material is an oxide material or TiN metal.

16. The structure of claim 9, wherein a boundary of the collector and the sub-collector is a highly doped region.

17. A method comprising:
- forming trenches in a substrate of a semiconductor on insulator wafer to expose an underlying buried oxide material:
- forming a cavity in the underlying buried oxide material through the trenches in the substrate;
- depositing doped polysilicon material in the cavity and the openings formed in the substrate;
- removing the doped polysilicon material which fills the openings;
- forming shallow trench isolation regions in the openings which isolate portions of the substrate;
- forming a base region on the substrate, between the shallow trench isolation regions; and
- forming an emitter region on the base region.

* * * * *